United States Patent
Hansel

(10) Patent No.: US 9,592,971 B2
(45) Date of Patent: Mar. 14, 2017

(54) PICK AND BOND METHOD AND APPARATUS FOR ATTACHMENT OF ADHESIVE ELEMENT TO SUBSTRATE

(75) Inventor: Mathias Hansel, Rummingen (DE)

(73) Assignee: A. Raymond Et Cie, Grenoble (FR)

( * ) Notice: Subject to any disclaimer, the term of this patent is extended or adjusted under 35 U.S.C. 154(b) by 766 days.

(21) Appl. No.: 13/695,910

(22) PCT Filed: May 3, 2011

(86) PCT No.: PCT/IB2011/001423
§ 371 (c)(1),
(2), (4) Date: Jan. 17, 2013

(87) PCT Pub. No.: WO2011/138684
PCT Pub. Date: Nov. 10, 2011

(65) Prior Publication Data
US 2013/0133817 A1   May 30, 2013

Related U.S. Application Data

(60) Provisional application No. 61/330,577, filed on May 3, 2010.

(51) Int. Cl.
*B29C 65/00* (2006.01)
*B32B 37/00* (2006.01)
(Continued)

(52) U.S. Cl.
CPC ............ *B65G 65/40* (2013.01); *B29C 65/02* (2013.01); *B29C 65/544* (2013.01);
(Continued)

(58) Field of Classification Search
CPC ............ B29C 65/00; B29C 65/7847; B29C 66/00145; B29C 66/82423;
(Continued)

(56) References Cited

U.S. PATENT DOCUMENTS 6,095,398 A * 8/2000 Takahashi et al. ............. 228/41
2006/0027624 A1 * 2/2006 Cobbley et al. ............. 228/20.1

FOREIGN PATENT DOCUMENTS

JP      08-025035      1/1996

* cited by examiner

*Primary Examiner* — Michael N Orlando
*Assistant Examiner* — Matthew Hoover
(74) *Attorney, Agent, or Firm* — LeClairRyan

(57) ABSTRACT

A method and apparatus for transferring formed adhesive elements from a reservoir (30) containing plural formed adhesive elements (12) to a bonding part attachable to a glass surface or other substrate through the use of adhesives. Transfer of the formed adhesive element to the bonding part (14) is accomplished by use of a vacuum tool (10) having a vacuum outlet, an internal plenum, and a series of vacuum lines formed in an adhesive element holding face. The vacuum tool is positioned over a reservoir of formed adhesive elements. Once the formed adhesive elements have been captured by the vacuum tool (10) the tool is used to place them into contact with the heated bonding part (14) directly or indirectly by intermediate placement onto a matrix (60) having a plurality of ejector pins (72) movably fitted therein. The ejector pins move the formed adhesive elements into position against the bonding part.

12 Claims, 7 Drawing Sheets

(51) Int. Cl.
    *B23K 3/00*          (2006.01)
    *B65G 65/40*        (2006.01)
    *F16B 11/00*        (2006.01)
    *H01L 21/48*        (2006.01)
    *B29C 65/02*        (2006.01)
    *B29C 65/54*        (2006.01)

(52) U.S. Cl.
    CPC .......... *F16B 11/006* (2013.01); *H01L 21/486* (2013.01); *Y10T 156/17* (2015.01)

(58) Field of Classification Search
    CPC ...... B29C 66/82661; B29C 2043/3605; B29C 44/42; B29C 2045/14155; B32B 37/00; B32B 37/10; B23K 3/00; B23K 3/027; B23K 3/06; B23K 3/0623; B23K 37/00; B23K 37/02; B23K 37/04; B23K 37/0417; B25B 11/005
    See application file for complete search history.

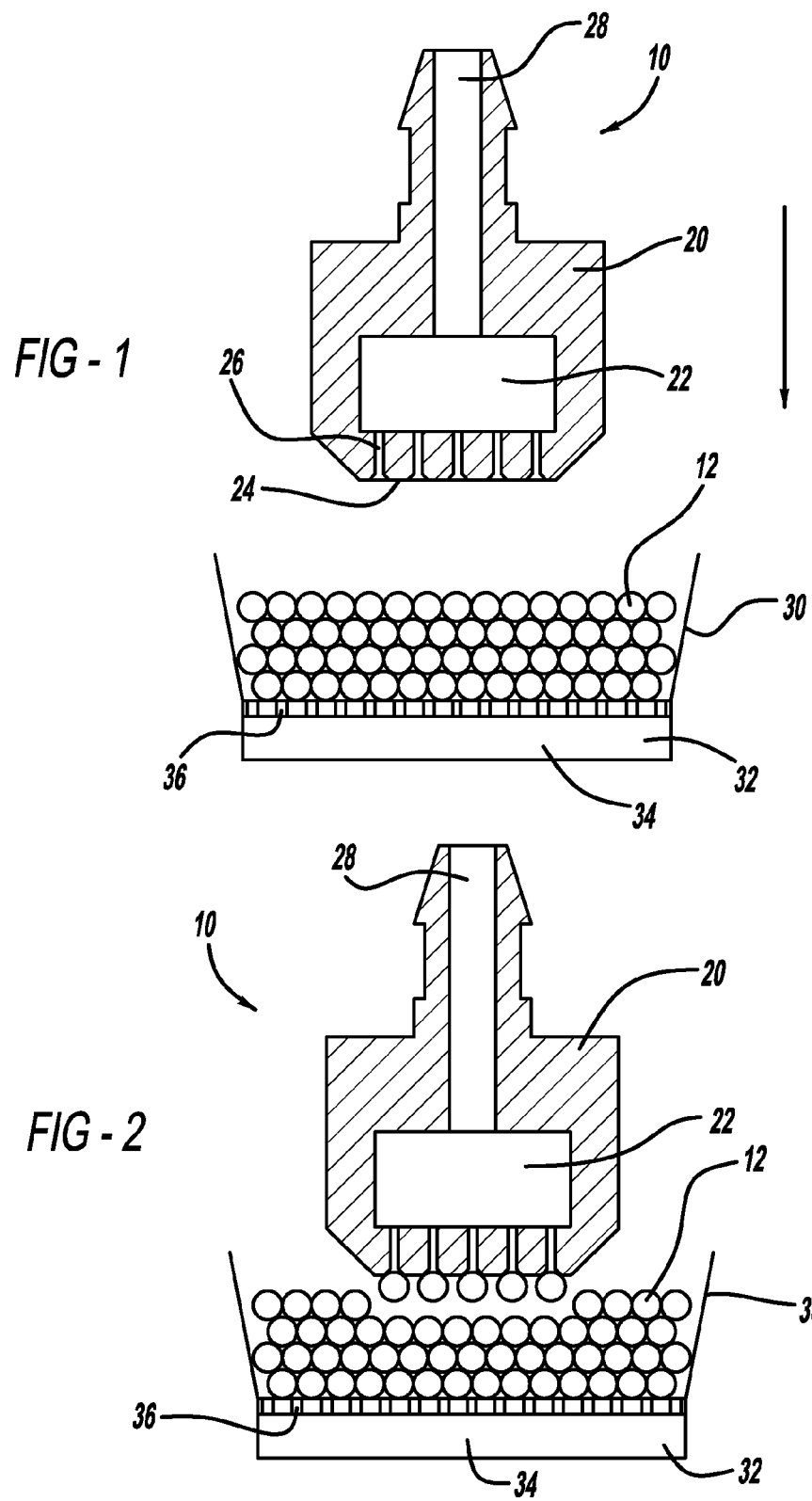

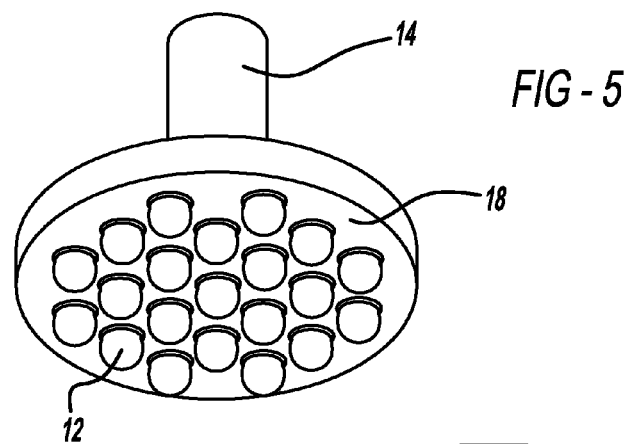
FIG - 5
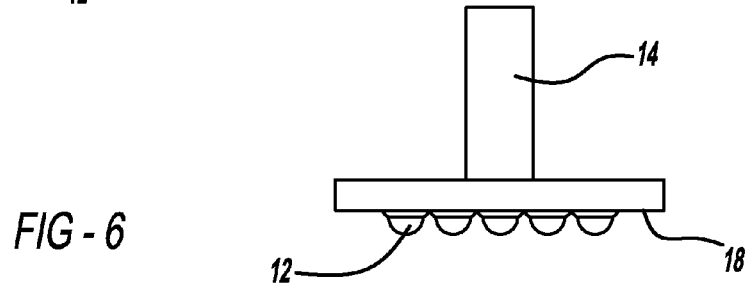
FIG - 6
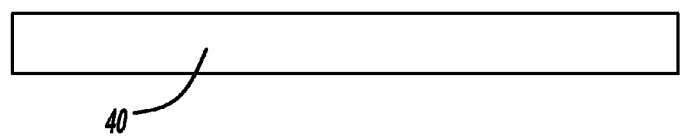
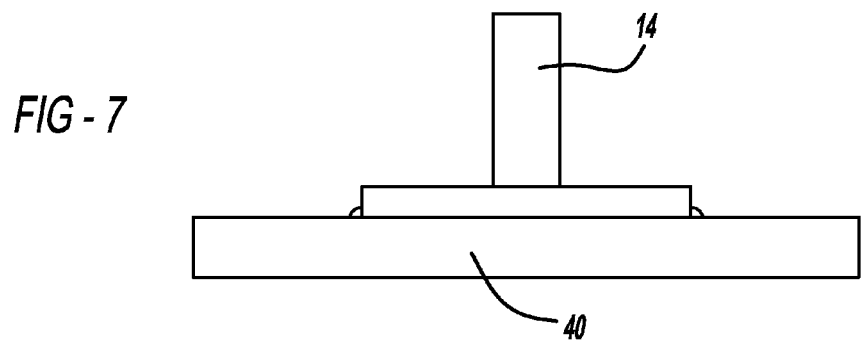
FIG - 7

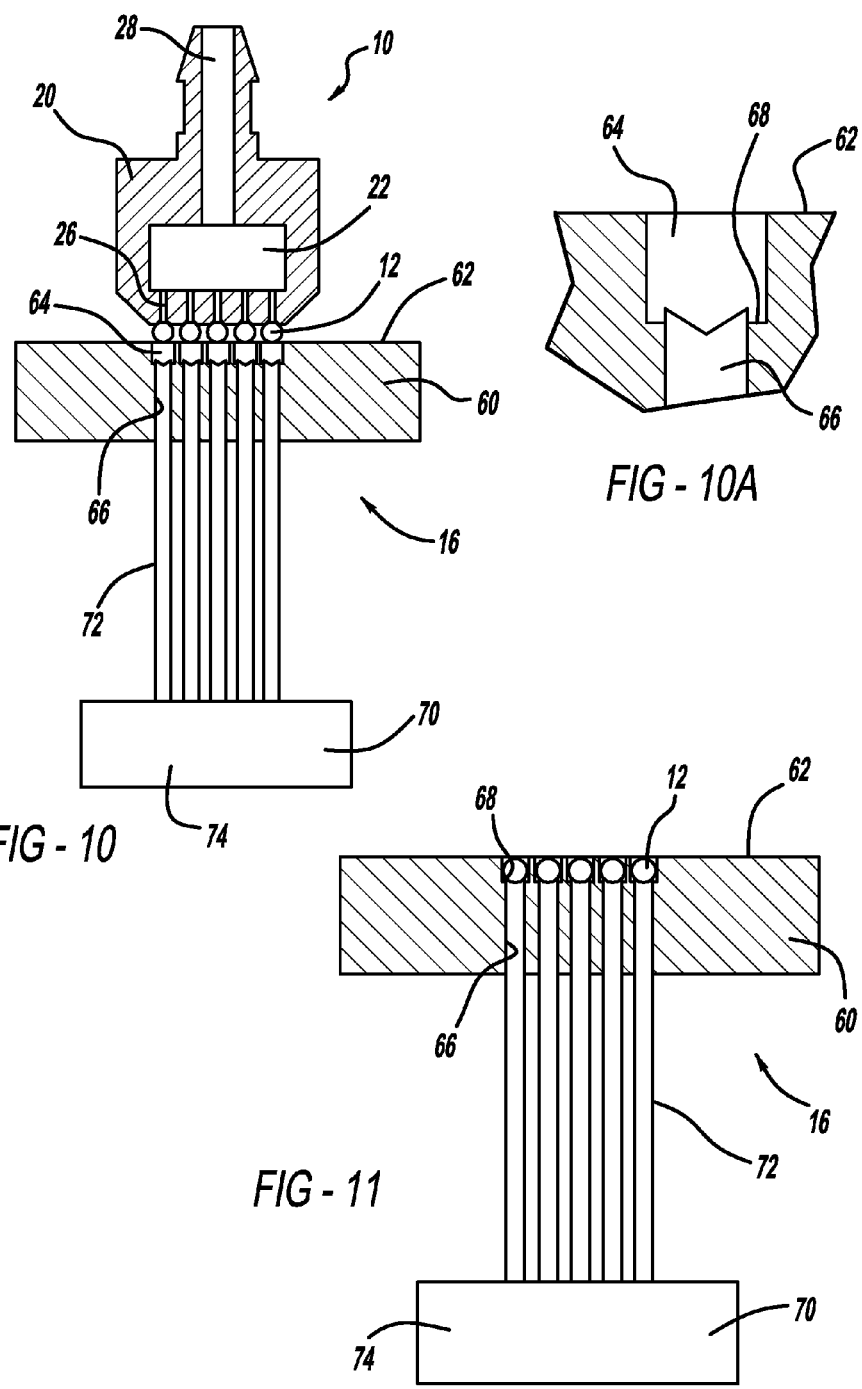

PICK AND BOND METHOD AND APPARATUS FOR ATTACHMENT OF ADHESIVE ELEMENT TO SUBSTRATE

TECHNICAL FIELD

The disclosed invention relates to a bonding part attachable to a glass surface or other substrate through the use of adhesives. More particularly, the disclosed invention relates to a method and apparatus for transferring a prepared adhesive element, such as a structural polyurethane, epoxy or other basic for an adhesive, pressed from a powder to an adhesive tablet, from a supply reservoir of prepared adhesive elements to a bonding part made of any one of several materials including metal, glass, ceramics, plastics, wood and composites for attachment to another component such as a glass surface or to another substrate made of materials such as metal, ceramics, plastics, wood and composites.

BACKGROUND OF THE INVENTION

Attachment of a first component to a second component for any of a variety of applications may be made by any of several known methods of fastening, including mechanical or chemical fastening. Mechanical fastening, while often practical and reliable, is not always usable for every application. For example, where a first component is being attached to a second component and it is not desirable or practical to drill into or otherwise modify the second component for mechanical attachment, chemical fastening is the only other alternative. This is the case where, for example, a component is to be attached to a glass surface or other substrate (the second component). An example of a component-to-glass arrangement may be seen in the automotive industry where a rear view mirror or a metal hinge needs to be attached to a glass surface. Other examples of component-to-glass attachment needs exist such as in home and office construction.

A solution to the bonding challenge was introduced in the form of an adhesive applied between the part to be attached (the bonding part) and the substrate to which the bonding part was attached. The adhesives have been applied in several ways.

According to one known approach the adhesive is applied to the bonding part by dosing with nozzles and spraying the adhesive onto the bonding part. While this process can be easy and often inexpensive, it suffers from the need to frequently clean the nozzles in order to maintain a desired level of consistency in the actual spraying from part to part. In addition, the sprayed adhesive tends to be sticky, thus resulting in the possibility that the bonding part will come into contact with another object between the time of the spraying of the adhesive and the actual attachment of the bonding part to the substrate.

According to another known approach a double-sided tape is applied to the bonding part. According to this approach a release layer is removed from one side of the tape and the tape is applied to the bonding part. The release layer on the other side of the tape is left in place until the bonding part is ready for attachment to the substrate. This approach offers advantages in that it is usable at room temperature and the adhesive for contact with the substrate is not exposed until needed. Furthermore, the adhesive does not require an adhesion promoter. However, while the release layer protects against the adhesive from being inadvertently attached to a surface, it also adds an inconvenient step in the process of attachment of the bonding part to the substrate in that the layer must be removed prior to attachment. The release layer may also tear resulting in a portion of the layer being left behind on the adhesive surface and creating the potential for imperfect adhesion of the bonding part to the substrate. The step of attaching the double-sided tape to the bonding part is also complicated by the fact that this arrangement of structural adhesives can only be used for in-line assembly in which the bonding part, the double-sided tape and the substrate pass through a heater such as an autoclave to achieve full bonding performance.

A third and more attractive method is to provide the bonding part with a formed adhesive element such as a tablet already in position prior to shipment of the bonding part to the end-user. This arrangement is attractive as it results in a bonding part that is ready to bond with no requirement that the end user attach the adhesive tablet to the bonding part. However, it may be that the end user wishes to apply the tablet at its facility and according to its own schedule and arrangement. In such a case the concept of a pre-applied adhesive such as the bonding tablet already fitted to the bonding part may not be the optimal choice.

Accordingly, as in so many areas of fastener technology, there is room in the art of bonding parts for an alternate approach to the manufacture of bonding parts.

SUMMARY OF THE INVENTION

The disclosed invention provides a method and apparatus for the transfer of a prepared adhesive element from a supply reservoir to a bonding part in a practical and efficient way. The formed adhesive element may be conveniently attached to the bonding part by the end-user prior to attachment of the bonding part to the substrate. In order to attach the formed adhesive element to the bonding part according to the disclosed invention, the bonding part is heated and then is moved in position relative to the formed adhesive element. As an alternative arrangement, the bonding part may be used without heating at room temperature. The bonding part is then moved into a pre-contact position relative to the formed adhesive element. Thereafter the bonding part is moved into contact with the formed adhesive element, or the adhesive elements are pushed with ejector pins against the adhesive coating surface of the bonding part. The bonding part, now having the formed adhesive element attached, is ready for attachment to the substrate. One or more formed adhesive elements may be attached to the bonding part.

Attachment of the formed adhesive element to the bonding part is accomplished by use of a vacuum tool having a vacuum outlet, an internal plenum, and a series of vacuum lines formed in an adhesive element holding face. The vacuum tool is positioned over a reservoir of formed adhesive elements. The reservoir may have multiple layers of formed adhesive elements or may have a single layer. If the reservoir has plural layers it may be fitted with a plenum and air lines to help lift the formed adhesive elements to move them into contact with the adhesive element attachment face of the vacuum tool.

Once the formed adhesive elements have been captured by the vacuum tool the tool is used to place them into contact with the heated bonding part directly or indirectly by intermediate placement onto a matrix having a plurality of ejector pins movably fitted therein.

In the event that the intermediate method of attachment is used, the vacuum tool releases the formed adhesive elements into a plurality of apertures formed in the surface of the matrix by switching off the vacuum. Pressure can be used to eject the formed adhesive elements. The matrix has channels extending from the apertures within which ejector pins are reciprocatingly positioned. The apertures have shoulders at their bases that prevent the formed adhesive elements from passing through the channels. The ejector pins can be guided in the matrix plate or in a plate underneath the matrix plate. Vacuum draws in the formed adhesive element into the formed adhesive holding apertures.

Once the formed adhesive elements are in position on the matrix the heated bonding part is positioned thereover and the ejector pins push the formed adhesive elements into contact with the heated bonding part.

Other advantages and features of the invention will become apparent when viewed in light of the detailed description of the preferred embodiment when taken in conjunction with the attached drawings and the appended claims.

BRIEF DESCRIPTION OF THE DRAWINGS

For a more complete understanding of this invention, reference should now be made to the embodiments illustrated in greater detail in the accompanying drawings and described below by way of examples of the invention wherein:

FIG. 1 is a sectional view of a vacuum tool for transferring the formed adhesive element shown in position above the reservoir of formed adhesive elements;

FIG. 2 is a view similar to that of FIG. 1 in which the vacuum tool has been moved into contact with some of the formed adhesive elements of the reservoir;

FIG. 5 is a view of the underside of the bonding part having a plurality of formed adhesive elements positioned thereon;

FIG. 6 is an elevational view of the bonding part and its formed adhesive elements relative to the substrate;

FIG. 7 is a view similar to that of FIG. 6 but showing the bonding part adhered to the substrate;

FIG. 10 illustrates the vacuum tool in position above the matrix according to an alternate embodiment of the method of attachment of the formed adhesive elements to a bonding part;

FIG. 11 illustrates the formed adhesive elements, now transferred from a reservoir, in position in the apertures formed in the upper surface of the matrix;

DETAILED DESCRIPTION OF THE PREFERRED EMBODIMENT

Figure 3:
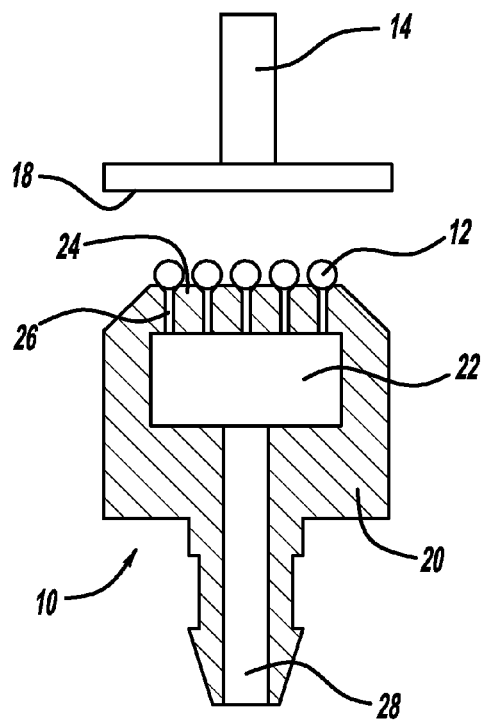
FIG. 3 is a view similar to that of FIGS. 1 and 2 but showing the vacuum tool in its inverted position relative to the bonding part.

In the following figures, the same reference numerals will be used to refer to the same components. In the following description, various operating parameters and components are described for different constructed embodiments. These specific parameters and components are included as examples and are not meant to be limiting.

The formed adhesive elements referenced in the present application and their attachment to a bonding part are generally discussed in U.S. Pat. No. 9,133,377, which issued to Bremont et al. for an invention titled Adhesive Polyurethane Powder Capable of Being Activated by Heat, and which is assigned to the same assignee as the present invention. A method and apparatus for positioning, holding and moving the formed adhesive elements for attachment to a bonding part are disclosed in U.S. Pat. No. 9,284,134, which issued to Hansel et al. for an invention titled Method and Apparatus for Placing Adhesive Element on a Matrix, and which is assigned to the same assignee as the present invention.

The figures illustrate a vacuum tool, generally illustrated as 10, used to transfer formed adhesive elements 12 from a reservoir either directly to a heated bonding part 14 or indirectly by first transferring the formed adhesive elements to a matrix assembly, generally illustrated as 16. The bonding part 14 includes an adhesive coating surface 18.

With reference to FIGS. 1 through 4, the vacuum tool 10 is illustrated. The vacuum tool 10 includes a vacuum tool body 20 having a vacuum tool body plenum 22 centrally formed therein. The vacuum tool 10 includes an adhesive element holding face 24. Formed through the adhesive element holding face 24 is a plurality of vacuum lines 26 in fluid communication with the vacuum tool body plenum 22. An outlet line 28 is also formed in fluid communication with the vacuum tool body plenum 22. The outlet line 28 is attached to a vacuum-forming pump (not shown).

A reservoir 30 is provided that is substantially filled with the formed adhesive elements 12. It should be understood that while the formed adhesive elements 12 are illustrated as having spherical shapes formed adhesive elements having other shapes, such as disc or oblong (neither shown), may be used with the disclosed invention. The first embodiment reservoir 30 includes a base 32 within which a first embodiment reservoir plenum 34 is formed. A series of air lines 36 is provided between the first embodiment reservoir plenum 34 and the interior of the first embodiment reservoir 30 into which pressurized air is introduced. The pressurized air passes into the first embodiment reservoir plenum 34 and out of the first embodiment reservoir plenum 34 out of the air lines 36 to help lift the formed adhesive elements 12 as may be needed for contact with the vacuum tool 10.

The arrangement shown in FIG. 1 illustrates the tool in its idle position.

In operation, and as shown in FIG. 2, a vacuum is created within the vacuum tool 10 and the vacuum tool 10 is lowered into the first embodiment reservoir 30 until contact with the formed adhesive elements 12 is made, assisted as needed by the above-described air flow system provided in the base 32 of the first embodiment reservoir 30. At this time certain ones of the formed adhesive elements 12 are drawn to the outer open ends of the vacuum lines 26 and are held in place by suction.

With certain ones of the formed adhesive elements 12 adhered to the adhesive element holding face 24 of the vacuum tool 10, the vacuum tool 10 is then moved to a position in which the formed adhesive elements 12 are facing the adhesive coating surface 18 of the bonding part 14 as shown in FIG. 3. This position can be an inverted position or can be any of a number of positions. The bonding part 14 may be held by a holding tool (not shown) during this part of the operation.

Figure 4:
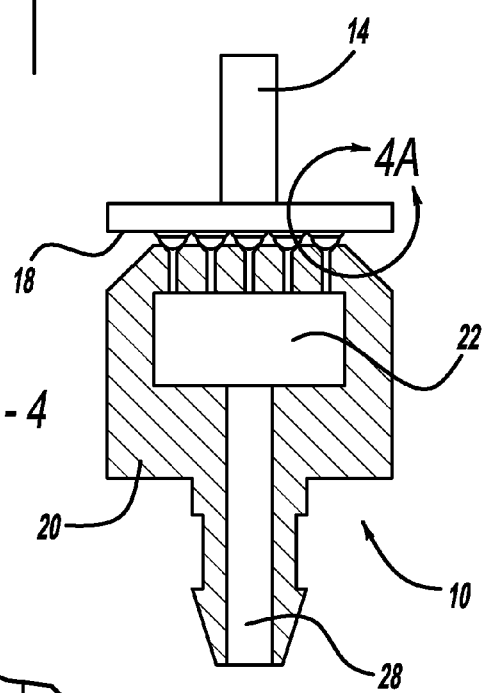
FIG. 4 is a view of the bonding part in contact with the formed adhesive elements held by the vacuum tool and having an insert which is a close-up of the interface of the adhesive side of the bonding part with the formed adhesive elements.
Figure 4A:
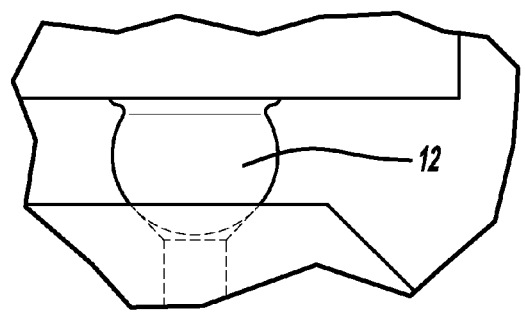

At some point prior to contact with the formed adhesive elements 12 the bonding part 14 is heated to a temperature sufficient to partially melt the contact area of the formed adhesive element 12 being attached. The heated bonding part 14 and the formed adhesive elements 12 are then put into contact with the formed adhesive elements 12 as illustrated in FIG. 4. An inset is provided in conjunction with FIG. 4 in which the slight melt of the formed adhesive element 12 is shown for attachment to the bonding part 14. The formed adhesive elements 12 are released by switching off the vacuum. Pressure can be used to eject the formed adhesive elements.

FIG. 5 generally shows the adhesive-contacting surface 18 of the bonding part 14 with the array of formed adhesive elements 12 attached thereto after processing according to the operations set forth in FIGS. 1 through 4 and discussed in conjunction therewith. The array of formed adhesive elements 12 shown in FIG. 5 are for illustrative purposes only and is not intended as being limiting as other arrays may be used.

Once the formed adhesive elements 12 are attached to the bonding part 14, the bonding part 14 is lowered into position relative to a substrate 40 so that the bonding part 14 bonds with the substrate 40. The pre-loading appearance of the bonding part 14 and the substrate 40 is illustrated in FIG. 6.

Once the bonding part 14 is properly adhered to the substrate 40 as shown in FIG. 7, the bonding part holding tool (not shown) releases the bonding part 14 and is withdrawn away from the bonding part 14.

Figure 8:
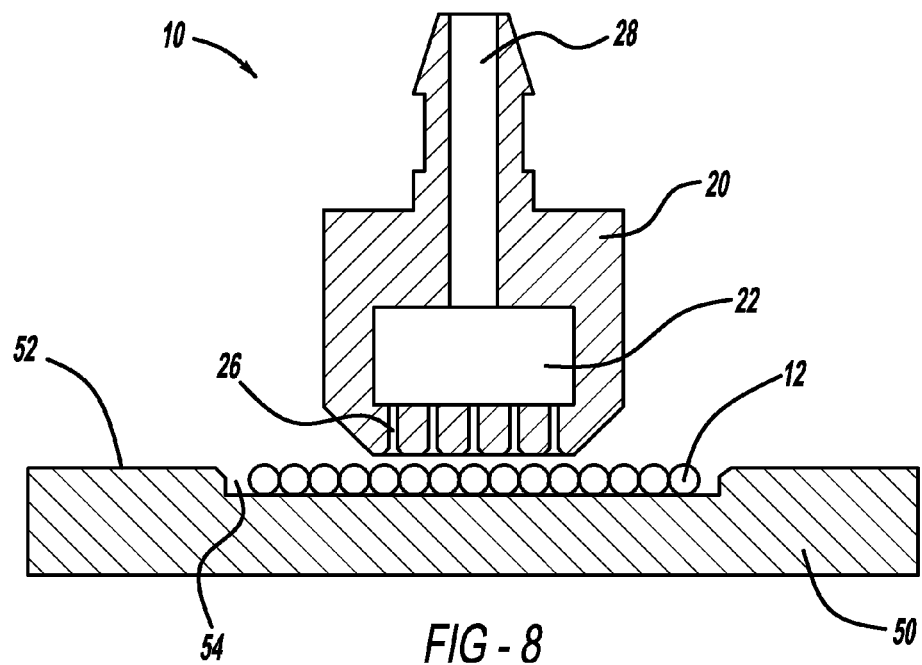
FIG. 8 is a view similar to that of FIG. 1 but showing an alternate embodiment of the reservoir such that a single layer of adhesive elements are provided.
Figure 9:
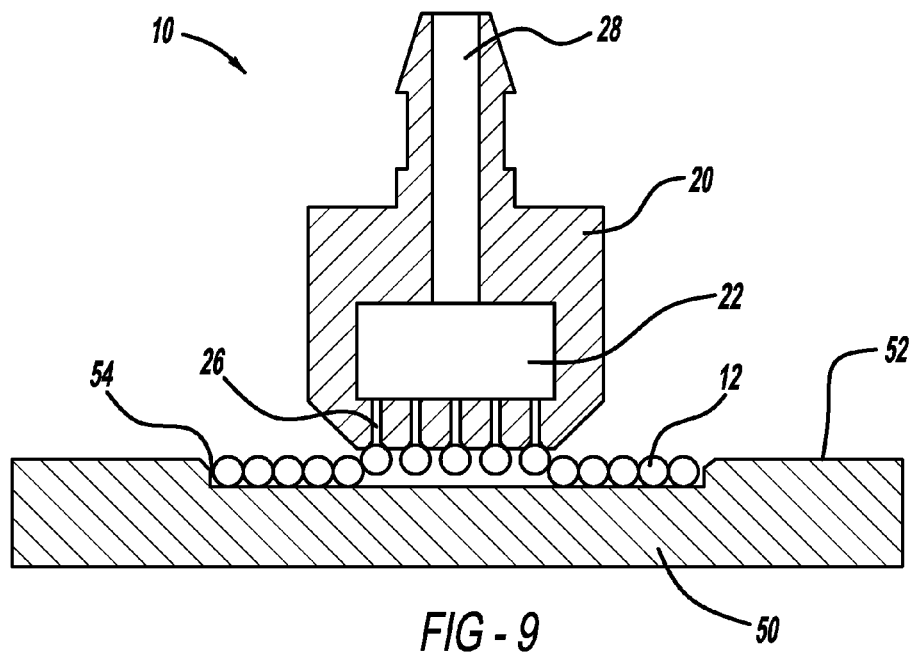
FIG. 9 is a view similar to that of FIG. 8 but showing the vacuum tool with a plurality of formed adhesive elements in place against the adhesive element holding face.

The first embodiment reservoir 30 shown in FIGS. 1 and 2 is one possible choice for use during the transfer operation of the disclosed invention. An alternative embodiment of the reservoir for holding the formed adhesive elements 12 is shown in FIGS. 8 and 9. With reference to these figures, a second embodiment reservoir 50 is shown having a face 52 is illustrated. The face 52 has a formed adhesive element holding recessed area 54 formed therein. A single layer of formed adhesive elements 12 is formed in the formed adhesive element holding recessed area 54.

In FIG. 8 the vacuum tool 10 is shown generally positioned above the formed adhesive elements 12 in the second embodiment reservoir 50. Air is drawn out of the vacuum tool 10 and it is lowered into position as shown in FIG. 9 such that certain ones of the formed adhesive elements 12 come into contact with the outer open ends of the vacuum lines 26 and are held in place by suction. The vacuum tool 10 and its complement of formed adhesive elements 12 is then positioned relative to a heated bonding part (not shown) for adhesion as set forth above with respect to FIGS. 3 and 4.

FIGS. 1 through 9 generally relate to the structure and use of the vacuum tool 10 for transferring formed adhesive elements 12 from a first embodiment reservoir 30 (or a second embodiment reservoir 50) directly to the heated bonding part 14. However, it may be preferred to transfer the formed adhesive elements 12 first to the matrix assembly 16 and then to the heated bonding part 14. This method of attachment and its associated apparatus is illustrated in FIGS. 10 through 13.

With reference to FIGS. 10 through 13, the vacuum tool 10 and the matrix 16 are illustrated. The matrix 16 includes a matrix body 60 having an upper surface 62. Formed within the upper surface 62 is a plurality of formed adhesive holding apertures 64. The lower end of each of the formed adhesive holding apertures 64 is continuous with an ejector pin channel 66. The inner diameter of the formed adhesive holding aperture 64 is greater than the inner diameter of the adjacent ejector pin channel 66 whereby a shoulder 68 is formed at the base of the formed adhesive holding aperture 64. The shoulder 68 prevents the formed adhesive element 12 from entering the ejector pin channel 66. The ejector pins can be guided in the matrix plate or in a plate underneath the matrix plate.

An ejector pin assembly 70 includes a plurality of ejector pins 72 attached to an ejector pin base 74. A portion of each of the plurality of ejector pins 72 is reciprocatingly fitted within its respective ejector pin channel 66. The ejector pin assembly 70 is operated by a drive unit (not shown) such that the ejector pins 72 move within the matrix body 60 simultaneously.

With particular reference to FIG. 10, the complement of formed adhesive elements 12 adhere to the adhesive element holding face 24 as the vacuum within the vacuum tool 10 still remains. The vacuum tool 10 is positioned above the matrix 16 as shown. Once the vacuum with the vacuum tool 10 is switched off, the formed adhesive elements 12 drop within their respective formed adhesive holding apertures 62 as illustrated in FIG. 11. Pressure can be used to eject the formed adhesive elements 12. In this FIG. 11, the vacuum tool 10 has been moved away.

Figure 12:
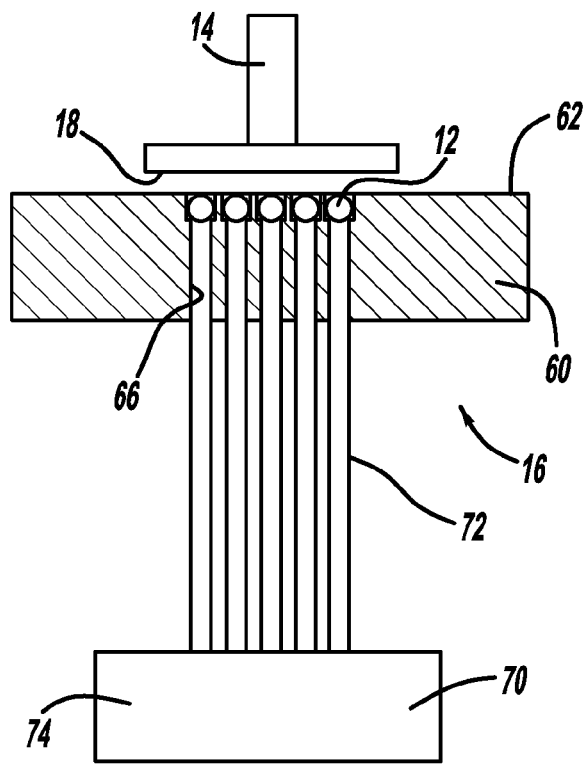
FIG. 12 illustrates the substrate positioned above the formed adhesive elements.
Figure 13:
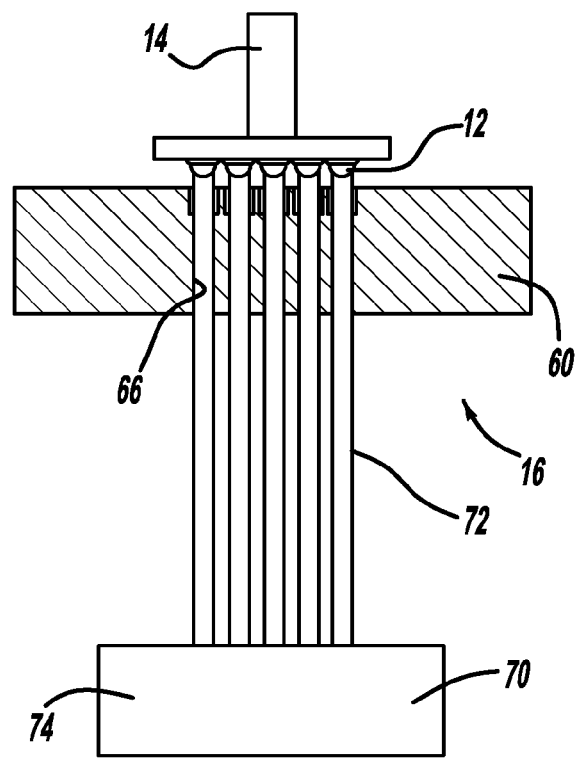
FIG. 13 illustrates the ejector pins of the matrix as having pushed the formed adhesive elements into contact with the bonding part.

With the formed adhesive elements 12 in place, the heated bonding part 14 is positioned over the matrix body 60 as shown in FIG. 12. Once in position, the ejector pin assembly 70 is manipulated such that the ejector pins 72 are moved into the matrix body 60 and press against the undersides of the formed adhesive elements 12, thus pushing the formed adhesive elements 12 against the adhesive coating surface 18 of the heated bonding part 14 as shown in FIG. 13. The heated bonding part 14 can then be moved away from the matrix assembly 16 and applied to the substrate 40 as shown and discussed above in relation to FIGS. 6 and 7.

Figure 14:
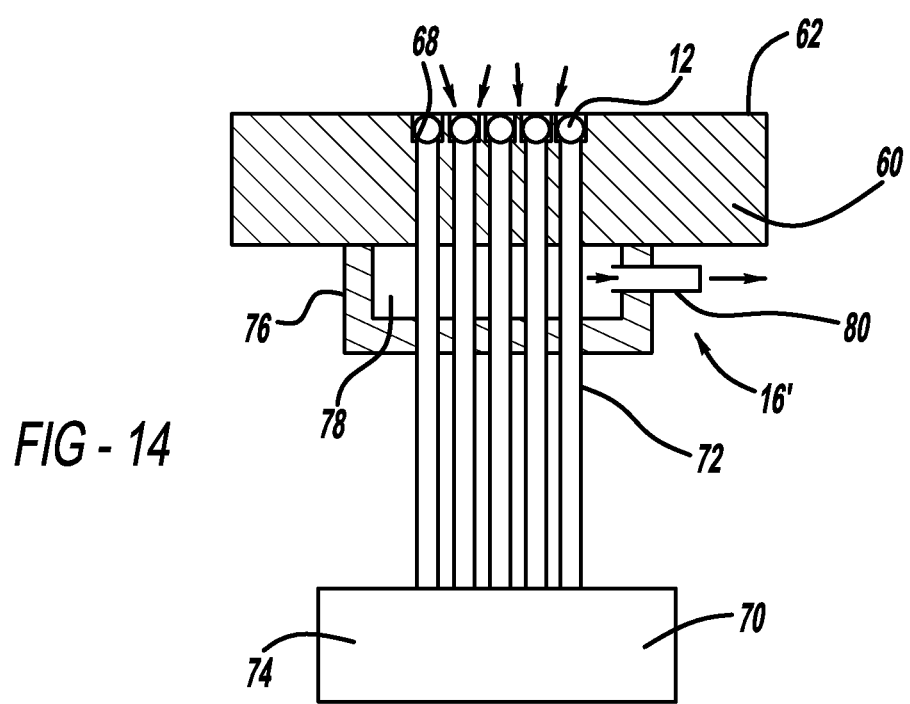
FIG. 14 illustrates an alternate embodiment of the matrix assembly according to the disclosed invention.

A vacuum arrangement may be provided to assist the formed adhesive elements 12 in being guided into and held in the formed adhesive element holding apertures 64. This arrangement is shown in FIG. 14 in which a matrix assembly 16' is shown. The matrix assembly 16' includes a vacuum assembly 76 having a vacuum chamber 78 formed therein. The vacuum chamber 78 is fluidly attached to an air exhaust line 80 which is itself fluidly attached to a vacuum pump (not shown). According to this arrangement, the vacuum helps to guide the adhesive elements 12 to the holding apertures 64. Once the formed adhesive elements 12 are positioned in the formed adhesive element holding apertures 64 the vacuum created by the vacuum chamber 78, the air exhaust line 80 and the associated vacuum pump assists in holding the formed adhesive elements 12 in place against the upper ends of the ejector pins 72.

The disclosed method and apparatus provides a robust, easy and cost effective method of transferring formed adhesive elements either directly to a bonding part or to the bonding part via a matrix.

The foregoing discussion discloses and describes exemplary embodiments of the present invention. One skilled in the art will readily recognize from such discussion, and from the accompanying drawings and claims that various changes, that modifications and variations can be made therein without departing from the true spirit and fair scope of the invention as defined by the following claims.

What is claimed is:

1. An apparatus for transferring a formed adhesive element to a bonding part, the apparatus comprising:
   a vacuum tool having a vacuum tool body and a plenum formed therein, said vacuum tool further including an adhesive element holding face having a plurality of vacuum lines in communication with said plenum, said vacuum tool further including an outlet line in fluid communication with said plenum;
   a reservoir for holding the formed adhesives; and
   a matrix separate and spaced apart from both said vacuum tool and said reservoir, said matrix having a matrix body, said matrix body having an upper surface, said upper surface including a plurality of adhesive holding apertures formed therein, said matrix further including an ejector pin assembly having attached thereto a plurality of solid ejector pins, and wherein said matrix body includes a plurality of ejector pin channels into which said plurality of ejector pins are at least partially located.

2. The apparatus of claim 1 wherein said reservoir has a depth, said depth being sufficient to hold multiple layers of the formed adhesive elements.

3. The apparatus of claim 2 wherein said reservoir includes a base, said base having a plenum formed therein.

4. The apparatus of claim 3 wherein said reservoir includes an interior and said base includes an upper wall, said upper wall having a plurality of air lines formed between said plenum of said base and said interior.

5. The apparatus of claim 1 wherein said reservoir has a depth, said depth being sufficient to hold only a single layer of the formed adhesive elements.

6. An apparatus for transferring a formed adhesive element to a bonding part, the apparatus comprising:
   a vacuum tool having a vacuum tool body and a plenum formed therein, said vacuum tool further including an adhesive element holding face;
   a reservoir for holding the formed adhesives; and
   a matrix separate and spaced apart from both said vacuum tool and said reservoir, said matrix having a matrix body, said matrix body having an upper surface, said upper surface including a plurality of adhesive holding apertures formed therein, said matrix further including an ejector pin assembly having attached thereto a plurality of solid ejector pins, and wherein said matrix body includes a plurality of ejector pin channels into which said plurality of ejector pins are at least partially located.

7. The apparatus of claim 6 wherein said vacuum tool body includes an outlet line in fluid communication with said plenum.

8. The apparatus of claim 6 wherein said adhesive element holding face includes a plurality of vacuum lines in communication with said plenum.

9. The apparatus of claim 6 wherein said reservoir has a depth, said depth being sufficient to hold multiple layers of the formed adhesive elements.

10. The apparatus of claim 9 wherein said reservoir includes a base, said base having a plenum formed therein.

11. The apparatus of claim 10 wherein said reservoir includes an interior and said base includes an upper wall, said upper wall having a plurality of air lines formed between said plenum of said base and said interior.

12. The apparatus of claim 6 wherein said reservoir has a depth, said depth being sufficient to hold only a single layer of the formed adhesive elements.

* * * * *